(12) United States Patent
Tanaka

(10) Patent No.: US 9,543,906 B2
(45) Date of Patent: Jan. 10, 2017

(54) OPTICAL RECEIVER TO ENHANCE DYNAMIC RANGE THEREOF

(71) Applicant: SUMITOMO ELECTRIC INDUSTRIES, LTD., Osaka-shi, Osaka (JP)

(72) Inventor: Keiji Tanaka, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 56 days.

(21) Appl. No.: 14/497,957

(22) Filed: Sep. 26, 2014

(65) Prior Publication Data

US 2016/0094191 A1    Mar. 31, 2016

(51) Int. Cl.
*H03F 3/08* (2006.01)
*H03F 1/08* (2006.01)
*H03F 3/45* (2006.01)

(52) U.S. Cl.
CPC .............. *H03F 3/08* (2013.01); *H03F 1/083* (2013.01); *H03F 3/087* (2013.01); *H03F 3/45475* (2013.01); *H03F 2200/135* (2013.01); *H03F 2200/474* (2013.01); *H03F 2203/45074* (2013.01); *H03F 2203/45138* (2013.01)

(58) Field of Classification Search
CPC .. H03F 3/08; H03F 3/45076; H03F 2200/135; H03F 2203/45074
See application file for complete search history.

(56) References Cited

U.S. PATENT DOCUMENTS 6,297,701 B1 * 10/2001 Visocchi ................. H03F 3/087
250/214 A
6,876,260 B2    4/2005 Visocchi

FOREIGN PATENT DOCUMENTS

JP    10-335957    12/1998
JP    2003-163544    6/2003

* cited by examiner

*Primary Examiner* — Tony Ko
(74) *Attorney, Agent, or Firm* — Smith, Gambrell & Russell, LLP.

(57) ABSTRACT

An optical receiver with an expanded dynamic range for an input current is disclosed. The optical receiver includes a photodiode to generate a photocurrent, a trans-impedance amplifier (TIA) to convert the photocurrent into a voltage signal, a dummy TIA with a same arrangement as that of the TIA to generate a reference, a differential amplifier to amplify a difference between the voltage signal and the reference, a current source to extract a portion of the photocurrent, and a level detector to detect an average photocurrent and adjust the reference based on the average photocurrent.

4 Claims, 6 Drawing Sheets

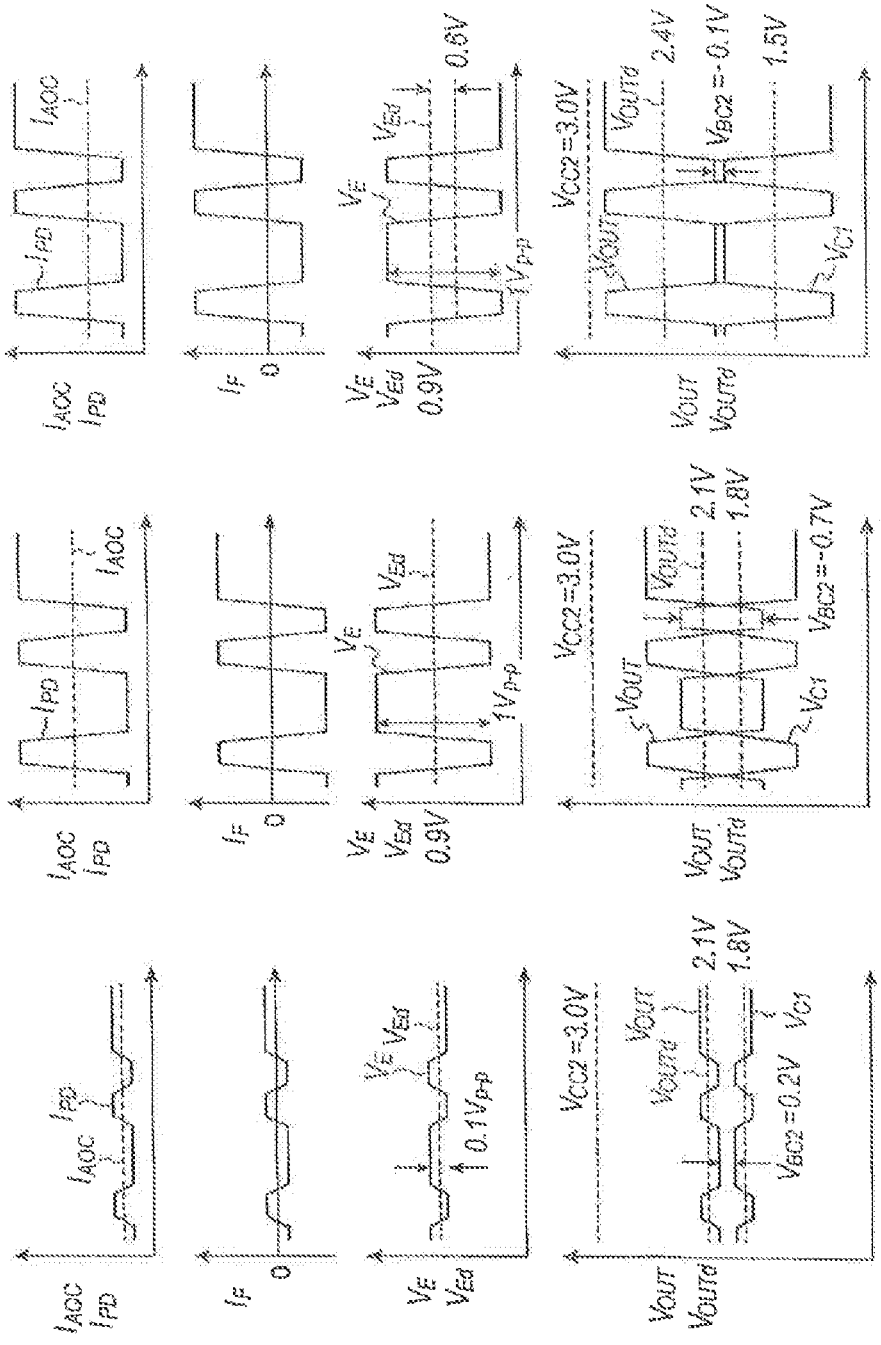

OPTICAL RECEIVER TO ENHANCE DYNAMIC RANGE THEREOF

BACKGROUND OF THE INVENTION

Field of the Invention

The present application relates to an optical receiver that converts a received optical signal into an electrical signal.

Related Background Art

Recent optical communication system installs optical receivers that convert optical signals transmitted through optical fibers with sensitivity. Such an optical receiver often implements a trans-impedance amplifier (TIA) in a front end thereof to amplify a faint signal converted from the received optical signal by a photodiode (hereafter denoted as PD).

Various techniques have been reported to enhance the dynamic range of a TIA. One technique installs a composite feedback element of a resistor and a diode connected in parallel to each other. A large input current automatically turns on the diode in the feedback element, which equivalently reduces the feedback impedance. Another prior art of a TIA provides a variable feedback resistor to vary, exactly reduce the closed feedback gain. However, such techniques are hard to secure the high frequency performance of the TIA. Also, a variable resistor implemented within the feedback element, which is typically a field effect transistor (FET), inevitably accompanies parasitic capacitance and degrades a small signal response of the TIA. One modification has been investigated to cope the response in a high input current with that in a small input current by raising an input DC level when the TIA receives the high input current. However, no TIA that fully satisfies the response for the small input current and that in the large input current without degrading temperature response of a TIA.

SUMMARY OF THE INVENTION

One aspect of the present invention relates to an optical receiver that includes a PD, first and second TIAs, a differential amplifier, an offset canceller, and a level detector. The PD generates a photocurrent by receiving an input optical signal. The first TIA converts the photocurrent kite a voltage signal, while, the second TIA generates a reference. The differential amplifier converts the voltage signal into two signals complementary to each other by differentiating the voltage signal from the reference. The offset canceller cancels an offset between the complementary outputs of the differential amplifier by extracting a portion of the photocurrent. The level detector detects the average of the photocurrent and outputs a control signal to the second TIA. The control signal varies the reference to widen the dynamic range of the first TIA.

The first and second TIAs have an arrangement substantially equal to each other, specifically, two TIAs have the two-stage amplifiers each including a bipolar transistor, a load resistor, and an emitter resistor where they are connected in series between the power supply and the ground. The voltage signal of the first TIA and the reference of the second TIA are output from the collector of the second stage amplifier. The control current from the level detector is provided to the emitter resistor of the second stage amplifier to decrease the collector current thereof. The reference, and/or the voltage signal, is provided as a voltage drop caused in the load resistor by the collector current. Accordingly, the decrease of the collector current in the second TIA enhances the reference. The offset canceller operates so as to cancel the offset between the voltage signal and the reference. Accordingly, the enhancement of the reference results in an increase of the voltage signal, which raises the collector level of the bipolar transistor of the second stage amplifier in the first TIA to secure fee amplifying operation of the bipolar transistor.

BRIEF DESCRIPTION OF THE DRAWINGS

The foregoing and other purposes, aspects and advantages will be better understood from the following detailed description of a preferred embodiment of the invention with reference to the drawings, in which:

FIG. 3 is a circuit diagram of a dummy TIA; and

FIG. 6A shows time behaviors of, from the top to the bottom, the photocurrent $I_{PD}$ and the cancelling current $I_{AOC}$, the feedback current $I_F$, the emitter levels, $V_E$ and $V_{Ed}$, and fee output voltages, $V_{OUT}$ and $V_{OUTd}$, respectively, for a small optical power, FIG. 6B shows time behaviors for a large optical power in a conventional circuit, and FIG. 6C shows time behaviors thereof for a large optical power in the present embodiment.

DESCRIPTION OF THE PREFERRED EMBODIMENTS

Next, some embodiments according to the present application will be described in detail as referring to accompanying drawings. In the description of the drawings, numerals or symbols same with or similar to each other will refer to elements same with or similar to each other without duplicated explanations.

Figure 1:
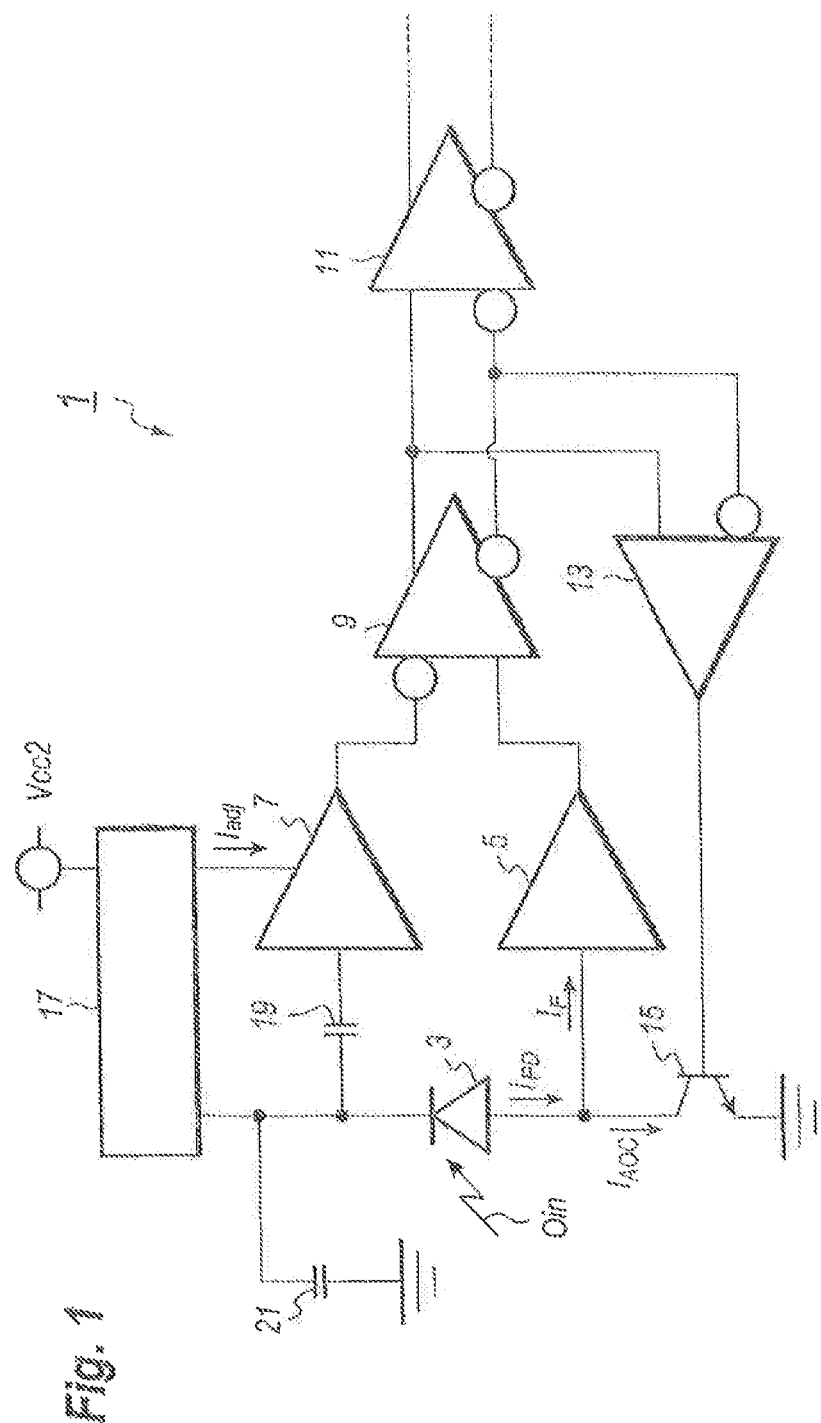
FIG. 1 shows a functional block diagram of an optical receiver according to an embodiment of the invention.

FIG. 1 is a functional block diagram of an optical receiver according to an embodiment of the present invention. The optical receiver 1 in FIG. 1, which is applicable to the optical communication system, receives an optical signal $O_{in}$ from a transmitting medium, which is not illustrated in figures but it is typically an optical fiber, and converts thus received optical signal $O_{in}$ into an electrical signal.

The optical receiver 1 includes a photodiode (PD) 3 to convert the received optical $O_{in}$ into a photocurrent; a trans-impedance amplifier (TIA) 5; another TIA 7, which is called as a dummy TIA in the present embodiment; first and second differential amplifiers, 9 and 11; an automatic offset canceller 13; a current source 15; and a level detector 17.

The TIA 5 couples with the anode of the PD 3 and converts the photocurrent $I_{PD}$ into a voltage signal $V_{OUT}$. The dummy TIA 7 couples with the cathode of the PD 3 through, a capacitor 19 whose capacitance is equivalent to the capacitance of the PD 3. The capacitance of the PD 3 is primarily derived from the junction capacitance of the PD 3. The dummy TIA 7 has an arrangement same with those of the TIA 5; that is, the circuit elements and the circuit configuration of the dummy TIA 7 is the same with those of the TIA 5. The dummy TIA 7 generates a reference $V_{OUTd}$ for converting the voltage signal $V_{OUT}$ of the single-phase configuration into two signals each having respective phases complementary to the other, namely, the dual-phase configuration.

The first differential amplifier 9 receives the voltage signal $V_{OUT}$ in the non-inverting input and the reference $V_{OUTd}$ the inverting input thereof. The differential amplifier 9 generates two signals complementary to each other, that is, two signals having magnitude substantially same with the other but the opposite phases. The second differential amplifier 11 provided in downstream of the first differential amplifier 9 further amplifies the outputs of the first differential amplifier 9 to preset amplitude as maintaining the relation of the complementary phase.

The offset canceller 13, which receives two outputs of the first differential amplifier 9, generates a control signal provided to the current source 15 such that a difference of DC components or respective averages of two outputs of the first differential amplifier 9 is compensated, or eliminated. The current source 15, which is a variable current source comprised of, for instance, a bipolar transistor and/or field effect transistor (FET), extracts a portion $I_{AOC}$ of the photocurrent $I_{PD}$ to be provided to the TIA 5 depending on the control signal from the offset canceller 13. Specifically, the transistor is connected in collector thereof to the anode of the PD 3 and the input of the TIA 5 to flow the cancelling current $I_{AOC}$ from the photocurrent $I_{PD}$. When the photocurrent $I_{PD}$ contains a large DC component, the cancelling current $I_{AOC}$ becomes large by the feedback function of the offset canceller 13 and the current source 15. On the other hand, when the photocurrent $I_{PD}$ contains a smaller DC component, the cancelling current $I_{AOC}$ reduces.

The level detector 17, which is coupled with the cathode of the PD 3 slid the bias input of the dummy TIA 7, supplies a reverse bias to the PD 3 and monitors an average optical power detected by the PD 3, which is reflected in the average of the photocurrent $I_{PD}$. The capacitor 21 connected between the input of the level detector 17 and the ground bypasses AC components of the photocurrent $I_{PD}$. The level detector 17 outputs a control current $I_{adj}$ reflecting the average of the photocurrent $I_{PD}$ to the dummy TIA 7.

Figure 2:
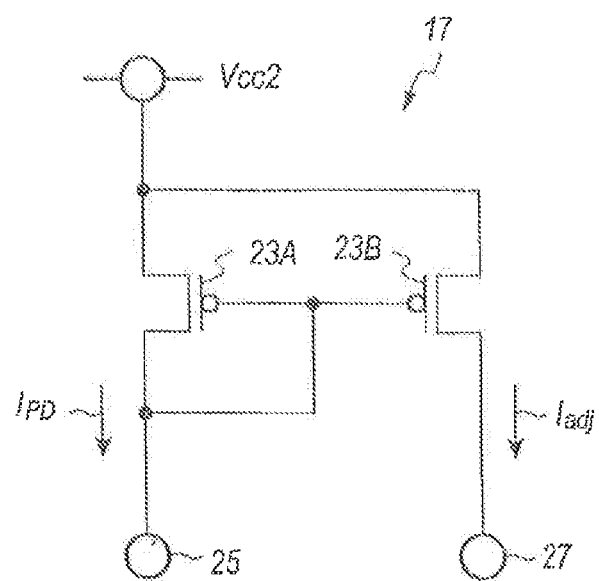
FIG. 2 is a circuit diagram of a level detector.

FIG. 2 is a circuit diagram of an example of the level detector 17. The exemplary level detector 17 shown in FIG. 2 includes two FETs, 23A and 23B, exactly, a current mirror circuit formed by two p-type FETs, 23A and 23B. Specifically two FETs, 23A and 23B, are commonly connected in the gates thereof, and also commonly connected in the sources thereof to the power supply Vcc2. The collector of the FET 23A is short-circuited to the gate thereof and connected to the output terminal 25. The collector of the other FET 23B is connected to the other output terminal 27. Coupling the output terminal 25 with the cathode of the PD 3, the photocurrent $I_{PD}$ flows out from the output terminal 25, and the control current $I_{adj}$, which is the mirror current reflecting the photocurrent $I_{PD}$, flows out from the other output terminal 27. When two transistors, 23A and 23B, have sizes substantially same with the other, the mirror current $I_{adj}$ becomes substantially equal to the source current $I_{PD}$ by the current mirror circuit shown in FIG. 2. The control current $I_{adj}$ is provided to the dummy TIA 7 to adjust the reference $V_{OUTd}$, which is output from the dummy TIA 7 to the first differential amplifier 9 as the reference level for converting a single phase signal into a differential signal. Thus, the reference $V_{OUTd}$ may be adjusted depending on the average optical power, equivalently, the average photocurrent $I_{PD}$.

Figure 3:
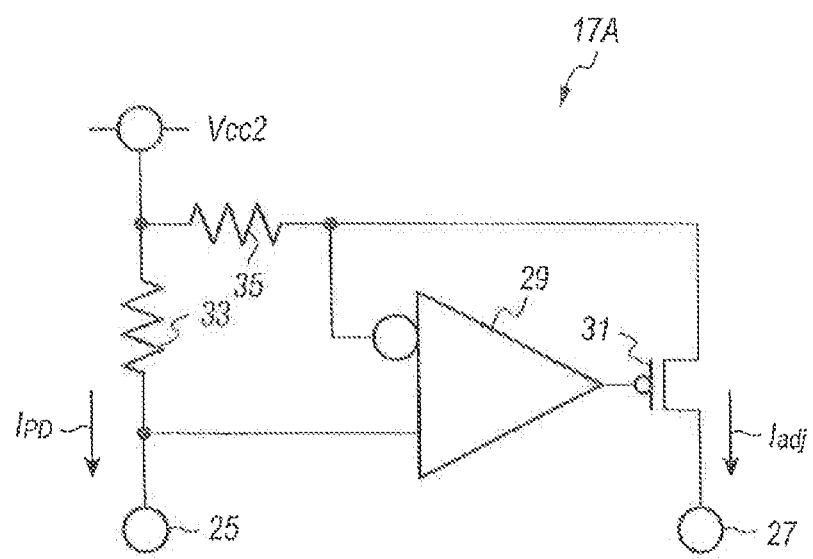
FIG. 3 is a circuit diagram of a modified level detector.

FIG. 3 is a circuit diagram of another example of the level detector 17A that includes an operational amplifier 29, an FET 31, and two resistors, 33 and 35. The resistor 33 is put between the output terminal 25 and the power supply Vcc2 to cause a voltage drop by the photocurrent $I_{PD}$ flowing therein. The other resistor 35 is connected between the inverting input of the amplifier 29 and the power supply 35 to cause a voltage drop by the control current $I_{adj}$ flowing therein. The FET 31, which may be a p-type FET, is connected between the inverting input of the amplifier 29 and the other output terminal 27. Because the operational amplifier 29 operates or generates an output thereof so as to make two input levels, the non-inverting input connected to the resistor 33 and the inverting input connected to the resistor 35, equal to each other, the control current $I_{adj}$ is set to be substantially equal to the photocurrent $I_{PD}$ when two resistors have the same resistance. Thus, the control current $I_{adj}$ may fully reflect the photocurrent $I_{PD}$.

Figure 4:
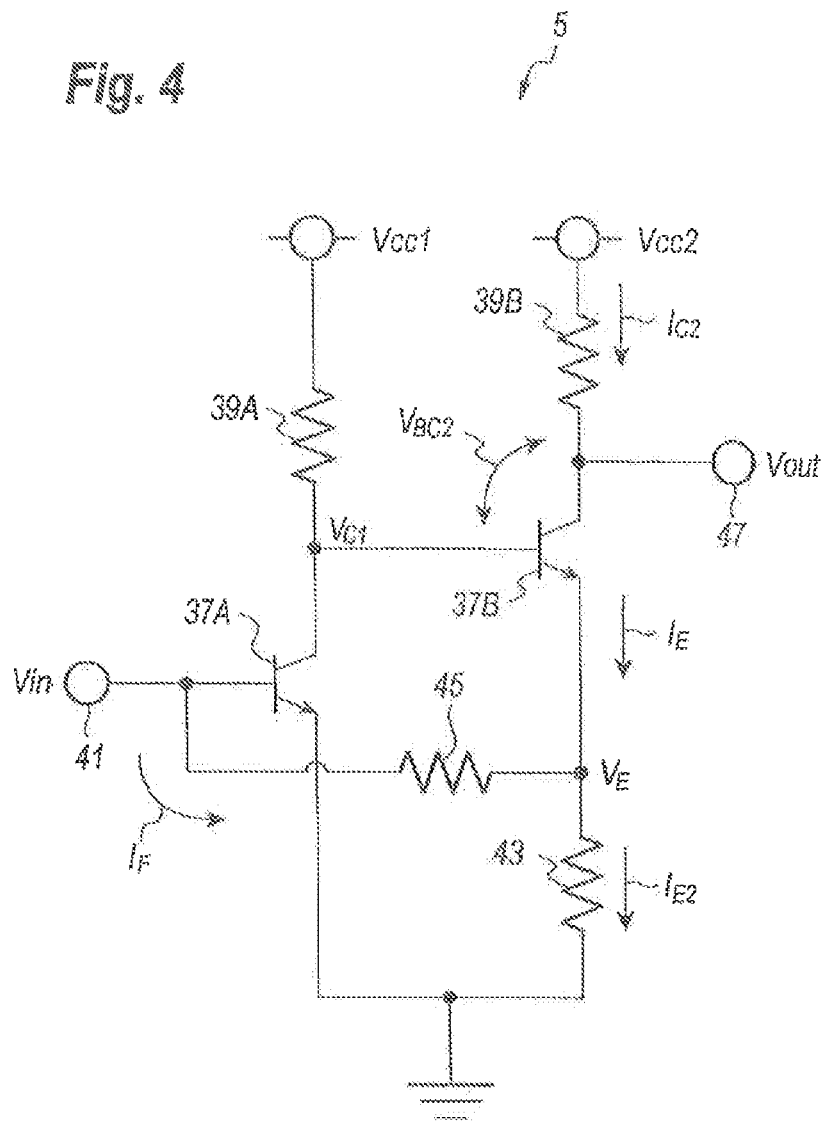
FIG. 4 is a circuit diagram of a TIA.
Figure 5:
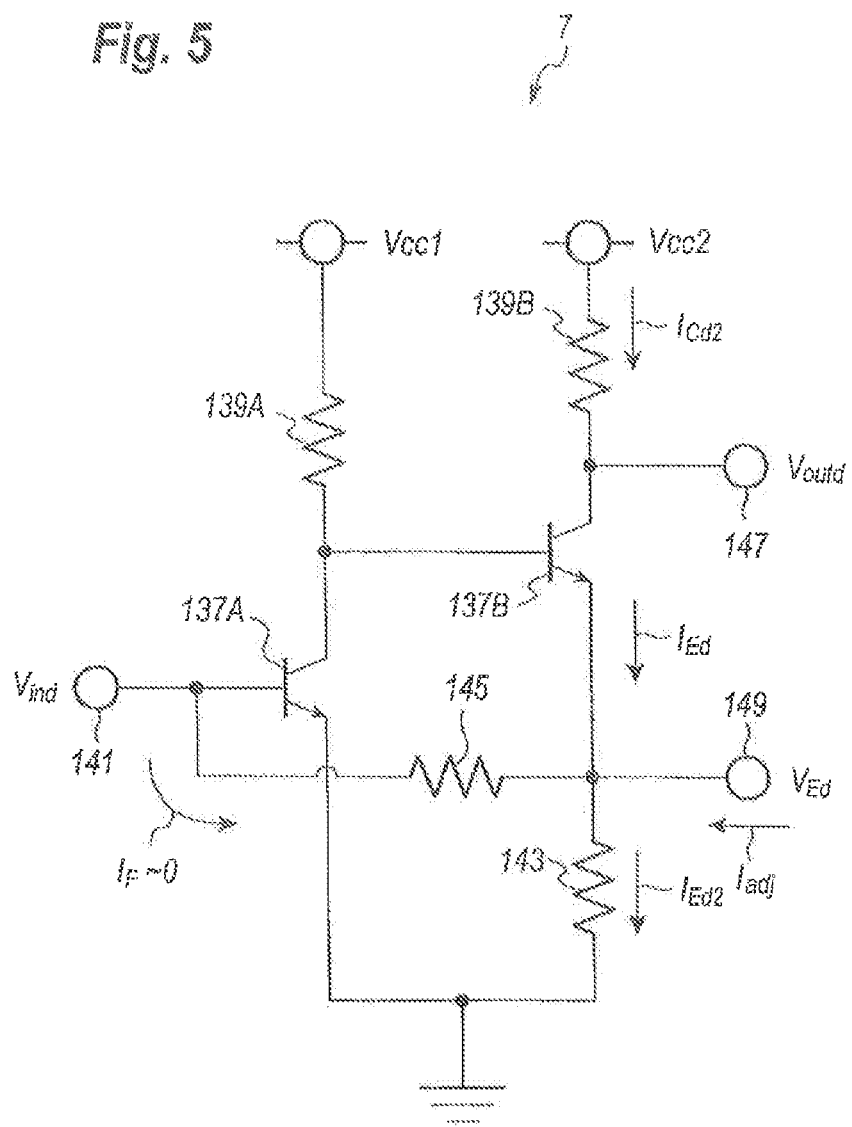

Next, details of the TIA 5 and the dummy TIA 7 will be described. FIG. 4 is a circuit diagram of the TIA 5, while, FIG. 5 is a circuit diagram of the dummy TIA 7.

First referring to FIG. 4, the TIA 5 is a type of the two-stage amplifier including two transistors, 37A and 37B. The first transistor 37A is the common emitter configuration where the collector is biased by the power supply Vcc1 through a load resistor 39A, the emitter is directly grounded and the base is coupled with the input terminal 41 to receive the input Vin. The second transistor 37B is also the common emitter configuration where the collector is biased by another power supply Vcc2 through a load resistor 39B, the base is coupled with the collector of the first transistor 37A, and the emitter is grounded through an emitter resistor 43. The output terminal 47 is coupled with the collector of the second transistor 37B to provide an output $V_{OUT}$. In addition, the emitter of the second transistor 37B is fed back to the base of the first transistor 37A through a feedback resistor 45.

Details of the dummy TIA 7 will be described as referring to FIG. 5. The dummy TIA 7, as shown in FIG. 5, has a circuit diagram substantially same with that of the TIA 5 except for an additional input terminal 149 to receive the control current $I_{adj}$ from the level detector 17. In the dummy TIA 7, the resistors, 139A to 145, may have the resistance same with those, 39A to 45, in the TIA 5, or increased from those, 39A to 45, in the TIA 5 by the same ratio. Specifically, when the resistors 139A to 145, have the resistance m (m>1) times greater than those of the resistors, 39A to 45, in the TIA 5, the sizes of the transistors, 137A and 137B, are necessary to be reduced by 1/m because the current flowing from the power supply Vcc2 to the ground becomes smaller. The parameter m is often called as the size factor. Then, the power consumed by the dummy TIA 7 may be reduced.

The operation of the TIA 5 and the dummy TIA 7 will be described. In the dummy TIA 7, substantially no input current $I_F$ is provided from the input terminal 141 because the input terminal 141 couples with the PD 3 through the coupling capacitor 19, and the PD 3 in the cathode thereof is grounded in the AC mode. The DC component appearing in the cathode of the PD 3 is fully isolated by the coupling capacitor 19. When the transistor 137A has a current amplification factor β large enough, a voltage drop induced in the feedback resistor 145 by the base current of the transistor 137A becomes small enough, which means that the output level is equal to the input level and the control current. $I_{adj}$ provided in the terminal 149 fully flows in the emitter resistor 143.

That is, the current flowing in the emitter resistor 143 is given by:

$$I_{Ed2}=I_{Ed}+I_{adj},$$

where $I_{Ed2}$ and $I_{Ed}$ are the current flowing in the emitter resistor 143 and the emitter current flowing out from the second transistor 137B. Setting the resistance of the resistor 143 and the resistor 43 in the TIA 5 to $R_{Ed2}$ and $R_{E2}$, respectively; and the size ratio of the dummy TIA 7 against the TIA 5 to m (m>1); then, the emitter current $I_{Ed}$ is given by:

$$I_{Ed} = V_{Ed}/R_{Ed2} - I_{adj} = V_{ind}/(m \times R_{E2}) - I_{adj}.$$

Thus, the emitter current $I_{Ed}$ may be adjusted by the control current $I_{adj}$ provided from the level detector 17.

Because the emitter current $I_{Ed}$ is substantially equal to the collector current $I_{Cd2}$, the output level $V_{OUTd}$ may be expressed as:

$$V_{OUTd} \sim Vcc2 - m \times R_{C2} \times I_{Ed}$$

$$= Vcc2 - R_{C2} \times V_{ind}/R_{E2} + m \times R_{C2} \times I_{adj},$$

where $R_{C2}$ and $m \times R_{C2}$ are the resistance of the collector load 39B of the TIA 5 and that 139B of the dummy TIA 7, respectively. Specifically, the control current $I_{adj}$ is proportional to the average of the optical input power, or the photocurrent $I_{PD}$; accordingly, as increasing the average of the optical input power, the emitter current $I_{Ed}$ of the transistor 137B decreases and the collector level thereof, which is the output $V_{OUTd}$ of the dummy TIA 7, increases the level.

On the other hand for the TIA 5, a substantial current $I_F$ appears in the input terminal 41 because the TIA 5 is coupled with the PD 3 in DC mode. Then, the emitter current $I_E$ of the transistor 37B becomes:

$$I_E = (V_{in} - I_F \times R_F)/R_{E2} - I_F,$$

where $R_F$ is resistance of the resistor 45. Then, the output level $V_{OUT}$ of the transistor 37B is:

$$V_{OUT} \sim Vcc2 - R_{C2} \times I_E$$

$$= Vcc2 - R_{C2} \times (V_{in} - I_F \times R_F)/R_{E2} + R_{C2} \times I_F.$$

The offset canceler 13 and the current source 15 operate such that two output levels, $V_{OUT}$ and $V_{OUTd}$, becomes equal to each other, or a difference between two levels, $\Delta V = |V_{OUT} - V_{OUTd}|$, disappears. Moreover, because two input levels, $V_{in}$ and $V_{ind}$, are substantially equal to each other, $V_{in} \sim V_{ind}$, and the input current $I_F$ for the TIA 5 is subtracted from the photocurrent $I_{PD}$ by the cancelling current $I_{AOC}$ flowing into the transistor 15, namely, $I_F = I_{PD} - I_{AOC}$; cancelling current $I_{AOC}$ is given by:

$$I_{AOC} = I_{PD} - (I_{adj} \times m \times R_{E2})/(R_{E2} + R_F).$$

In other words, the offset canceller 13 sets the cancelling current $I_{AOC}$ defined by the equation above described. Thus, the offset canceller 13 extracts a portion $I_{AOC}$ of the photocurrent $I_{PD}$ in a whole range of the input optical power, which means that the offset canceller 13 may cancel the offset appearing the output of the differential amplifier 9. Because the control current $I_{adj}$ is practically proportional to the average input power, the cancelling current $I_{AOC}$ becomes substantially equal to the photocurrent $I_{PD}$, $I_{AOC} \sim I_{PD}$, when the average input power is smaller, which means that, substantially no DC current flows into the TIA 5 for small input power. On the other hand, when the average input power becomes substantial, the DC current corresponding to the second term in the above equation flows into the TIA 5.

Thus, according to the optical receiver 1, the TIA 5 converts the photocurrent $I_{PD}$ into the voltage signal $V_{OUT}$, while, the dummy TIA 7 provides the reference $V_{OUTd}$ to convert the voltage signal $V_{OUT}$ of the single phase into the differential signal, where the reference $V_{OUTd}$ corresponds to, or proportional to, the average of the input optical power.

Because the reference $V_{OUTd}$ fully reflects the average input power, the optical receiver 1 may operate in a whole range of the optical input power without implementing with an integrating filter to pass only low-frequency (LF) components of the voltage signal $V_{OUT}$, where the integrating filter is often provided between the TIA 5 and the differential amplifier 9 to generate an average of the voltage signal $V_{OUT}$. Moreover, the optical receiver 1 provides the offset canceller 13 to cancel the output offset of the differential amplifier 9. The offset canceller 13 operates to compensate the output offset caused by an offset between two output signals, $V_{OUT}$ and $V_{OUTd}$. Although the output $V_{OUTd}$ of the dummy TIA 7 corresponds to the average of the voltage signal $V_{OUT}$, two TIAs, 5 and 7, independently operate and inevitably cause an offset between respective outputs, which finally results in the output offset of the differential amplifier 9. The offset canceller 13 may effectively cancel the output offset of the differential amplifier 9 by extracting a portion $I_{AOC}$ of the photocurrent $I_{PD}$.

Two TIAs, 5 and 7, have the configuration of the two stage transistors, and the dummy TIA 7, depending on the average of the photocurrent $I_{PD}$, decreases the output current of the second stage transistor to increase the reference level $V_{OUTd}$. Thus, the increase of the reference level $V_{OUTd}$ for a large photocurrent $I_{PD}$ may effectively prevent the second stage transistor 37B in the TIA 5 from being saturated, which improves the overload characteristic, namely, the performance of a large input power, in particular, the frequency response for a large power. Moreover, the power dissipation of the dummy TIA 7 is set to be small enough by setting the size factor m.

The operation of the optical receiver 1 of the present embodiment will be further described as referring to FIGS. 6A to 6C which show time behaviors of respective signals. That is, FIG. 6A shows time behaviors of, from the top to the bottom, the photocurrent $I_{PD}$ and the cancelling current $I_{AOC}$, the feedback current $I_F$ (the current input to the TIA 5), the emitter voltage, $V_E$ and $V_{Ed}$, and the output voltages. $V_{OUT}$ and $V_{OUTd}$, respectively, each for smaller input power; FIG. 6B shows time behaviors of them at larger input power for a conventional optical receiver; and FIG. 6C shows time behaviors of them for the larger input power of the present embodiment.

For the smaller input power, as shown in FIG. 6A, the offset canceller 13 operates such that the cancelling current $I_{AOC}$ becomes substantially equal to the average of the photocurrent $I_{PD}$. Then, the average feedback current $I_F$ flowing in the feedback resistor 45 in the TIA 5 becomes zero, the emitter level $V_{Ed}$ of the dummy TIA 7 becomes equal to the average of the emitter level $V_E$ of the TIA 5, and the output level $V_{OUTd}$ of the dummy TIA 7 also becomes equal to the output $V_{OUT}$ of the TIA 5. Thus, the mono-phase to the dual-phase conversion by the differential amplifier 9 may be adequately carried out. Assuming the resistance of the feedback resistor 45 and the photocurrent $I_{PD}$ are 500 Ω and 100 μAp-p, respectively, namely, the average of 50 μA, the emitter shows the amplitude $V_E$ of 100 mVp-p. Because the input level Vin is generally around 0.9 V, the average of the emitter level $V_E$ also becomes around 0.9 V. Setting the power supply Vcc2 and balancing the resistance of two resistors, $R_{C2} = R_{E2}$, the output $V_{OUT}$ becomes 2.1 V which is lower from the power supply Vcc2 by 0.9 V. Those conditions are often appearing in a practical operation of the two-stage amplifier. In such a condition, the second-stage transistor 37B may be biased over 0.2 V in the base-collector junction $V_{BC2}$, which operates the second-stage transistor 37B as an amplifier.

FIG. 6B corresponds to a conventional optical receiver that receives large optical power, where the conventional optical receiver is assumed to have no level detector 17. In the conventional optical receiver, the photocurrent $I_{PD}$ increases as the average input power increases. The offset canceller 13 operates such that the cancelling current $I_{AOC}$ becomes equal to the average of the photocurrent $I_{PD}$, which results in a condition where the second-stage transistor 37B does not operate as an amplifier, specifically, the base-collector bias $V_{BC2}$ thereof is not secured. In a case where the photocurrent $I_{PD}$ is 2 mAp-p (the average of 1 mA), the amplitude of the emitter level $V_E$ becomes 1.0 Vp-p and the output voltage $V_{OUT}$ also shows fee amplitude of 1.0 Vp-p with the average of 2.1 V. While, the base of the second-stage transistor 37B swings, with respect to the emitter bias $V_E$ thereof, in a same phase but slightly greater amplitude around the level higher by a forward junction voltage (0.8~0.9 V), that is, the base of the second-stage transistor 37B swings about 1.0 Vp-p around 1.8 V. Under such a condition, the base-collector bias $V_{BC2}$ of the second-stage transistor 37B becomes −0.7V in the worst condition, which is unable for the second stage transistor 37B to operate as an amplifier. The base-collector junction is forwardly biased when the optical signal is off, namely, in the low level, which degrades the performance, in particular, the operational speed of the transistor and extremely distorts the output of the TIA 5.

FIG. 6C corresponds to the optical receiver 1 of the present embodiment feat provides the level detector 17. The level detector 17 adjusts the current $I_{adj}$ provided to the dummy TIA 7 to suppress the cancelling current $I_{AOC}$ smaller than the average of the photocurrent $I_{PD}$ and the substantial current $I_F$ flows in the feedback resistor 45 to lower the emitter level $V_E$ compared with the conventional circuit. Then, the average of the output $V_{OUT}$ rises to secure the amplifying operation of the second-stage transistor 37B. Specifically, under the conditions same with those corresponding to FIG. 6B, the level detector 17 provides the control current $I_{adj}$, whose magnitude is ³⁄₁₀ of the photocurrent $I_{PD}$, to the dummy TIA 7, which rises the output $V_{OUTd}$ by 0.3 V and lowers the emitter level $V_{Ed}$ by 0.3 V. Because the offset canceller 13 operates such that two outputs, $V_{OUTd}$ and $V_{OUT}$, becomes equal, the increase of the reference $V_{OUTd}$ by 0.3 V results in the increase of the output $V_{OUT}$ by 0.3 V and the decrease of the emitter level $V_E$ by 0.3 V, which, also decreases of the collector level $V_{C1}$ of the first-stage transistor 37A or the base level of the second-stage transistor 37B. Accordingly, the base-collector bias $V_{BC2}$ of the second-stage transistor 37B becomes −0.1 V even in the worst case thereof, which secures the high-speed operation of the second-stage transistor 37B.

The control current shows the same function with that described above even when the input power is small. However, leaving the cancelling current $I_{AOC}$ in substantial when the input power is small, the minimum receiving sensitivity degrades because the cancelling current $I_{AOC}$ causes shot noise in the current source 15 and the first stage transistor 37A. However, the present optical receiver decreases the cancelling current $I_{AOC}$ in the small input power; accordingly, the shot noise due to the cancelling current $I_{AOC}$ is substantially ignorable. When the input optical power becomes large, the photocurrent $I_{PD}$ also increases to compensate the increase of the cancelling current $I_{AOC}$ and the shot noise is also ignorable.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An optical receiver to receive an optical signal, comprising:
   a photodiode to generate a photocurrent corresponding to the received optical signal;
   a first trans-impedance amplifier (TIA) to convert the photocurrent into a voltage signal,
   a second TIA having a same arrangement as an arrangement of the first TIA, the second TIA outputting a reference;
   a differential amplifier to amplify a difference between the voltage signal and the reference, the differential amplifier outputting two outputs complementary to each other;
   an offset canceller to extract a portion of the photocurrent based on the outputs of the differential amplifier; and
   a level detector to detect an average of the photocurrent, the level detector outputting a control current to the second TIA to vary the reference,
   wherein the first TIA and the second TIA each have a first stage amplifier including a first bipolar transistor and a second stage amplifier including a second bipolar transistor, the second stage amplifiers of the first TIA and the second TIA respectively outputting the voltage signal and the reference,
   wherein the second TIA receives the control current from the level detector, the control current varying a current flowing in the second stage amplifier of the second TIA,
   wherein the second stage amplifier of the second TIA includes a load resistor, the second bipolar transistor, and an emitter resistor connected in series between a power supply and ground, the reference being output as a voltage drop caused in the load resistor by a collector current flowing in the second stage amplifier of the second TIA, and
   wherein the control current is provided to the emitter resistor to decrease the collector current in the second stage amplifier of the second TIA.

2. The optical receiver of claim 1,
   wherein the level detector includes a current mirror circuit reflecting the photocurrent flowing therein as a source current for the control current flowing therein as a mirror current.

3. An optical receiver to receive an optical signal, comprising:
   a photodiode to generate a photocurrent corresponding to the received optical signal;
   a first trans-impedance amplifier (TIA) to convert the photocurrent into a voltage signal,
   a second TIA having a same arrangement as an arrangement of the first TIA, the second TIA outputting a reference;
   a differential amplifier to amplify a difference between the voltage signal and the reference, the differential amplifier outputting two outputs complementary to each other;
   an offset canceller to extract a portion of the photocurrent based on the outputs of the differential amplifier; and
   a level detector to detect an average of the photocurrent, the level detector outputting a control current to the second TIA to vary the reference,
   wherein the first TIA and the second TIA each have resistors and transistors, the resistors in the second TIA having resistances greater than resistances of the resistors in the first TIA by a size factor m, the transistors in the second TIA having a size of 1/m of a size of the transistors in the first TIA, and wherein the second TIA has a power consumption smaller than a power consumption of the first TIA.

4. The optical receiver of claim 3, wherein the level detector includes a current mirror circuit reflecting the photocurrent flowing therein as a source current for the control current flowing therein as a mirror current.

\* \* \* \* \*